(12) United States Patent
Behrends et al.

(10) Patent No.: US 6,244,675 B1
(45) Date of Patent: Jun. 12, 2001

(54) FAIL-SAFE BRAKE SYSTEM

(75) Inventors: Holger Behrends, Hannover; Christof Maron, Regenstauf; Thomas Dieckmann, Pattensen, all of (DE)

(73) Assignee: Continental Aktiengesellschaft, Hannover (DE)

( * ) Notice: Subject to any disclaimer, the term of this patent is extended or adjusted under 35 U.S.C. 154(b) by 0 days.

(21) Appl. No.: 09/391,457

(22) Filed: Sep. 8, 1999

(30) Foreign Application Priority Data

Sep. 8, 1998 (DE) .............................. 198 40 944

(51) Int. Cl.$^7$ ...................................... B60T 8/34
(52) U.S. Cl. ........................................ 303/155; 303/113.4
(58) Field of Search .............................. 303/3, 7, 15, 20, 303/153.4, 155; 188/156

(56) References Cited

U.S. PATENT DOCUMENTS 5,230,549 * 7/1993 Osada et al. ............................ 303/3
5,954,407 * 9/1999 Schramm et al. .................... 303/155

FOREIGN PATENT DOCUMENTS 195 10 525    9/1996 (DE).

* cited by examiner

*Primary Examiner*—Christopher P. Schwartz
(74) *Attorney, Agent, or Firm*—Smith, Gambrell & Russell, LLP

(57) ABSTRACT

A fail-safe system 2, in which the position of an actuating device 4 is measured by three sensors 8, 10 and 12 that operate independently of one another. The sensor 8 is directly supplied with energy by a first energy source 20, and the sensor 12 is directly supplied with energy by the second energy source 22 of the system 2. The sensor 10 is supplied with energy by the first energy source 20 or by the second energy source 22 via a diode circuit 14, 16 such that, if one of the energy sources 20 or 22 fails, two of the three sensors 8, 10 and 12 are still supplied with energy. A majority decision can be carried out in the microprocessors 32 or 34 if the signal of one sensor is lacking, wherein it can also be determined which of the energy sources 20 or 22 has failed.

14 Claims, 1 Drawing Sheet

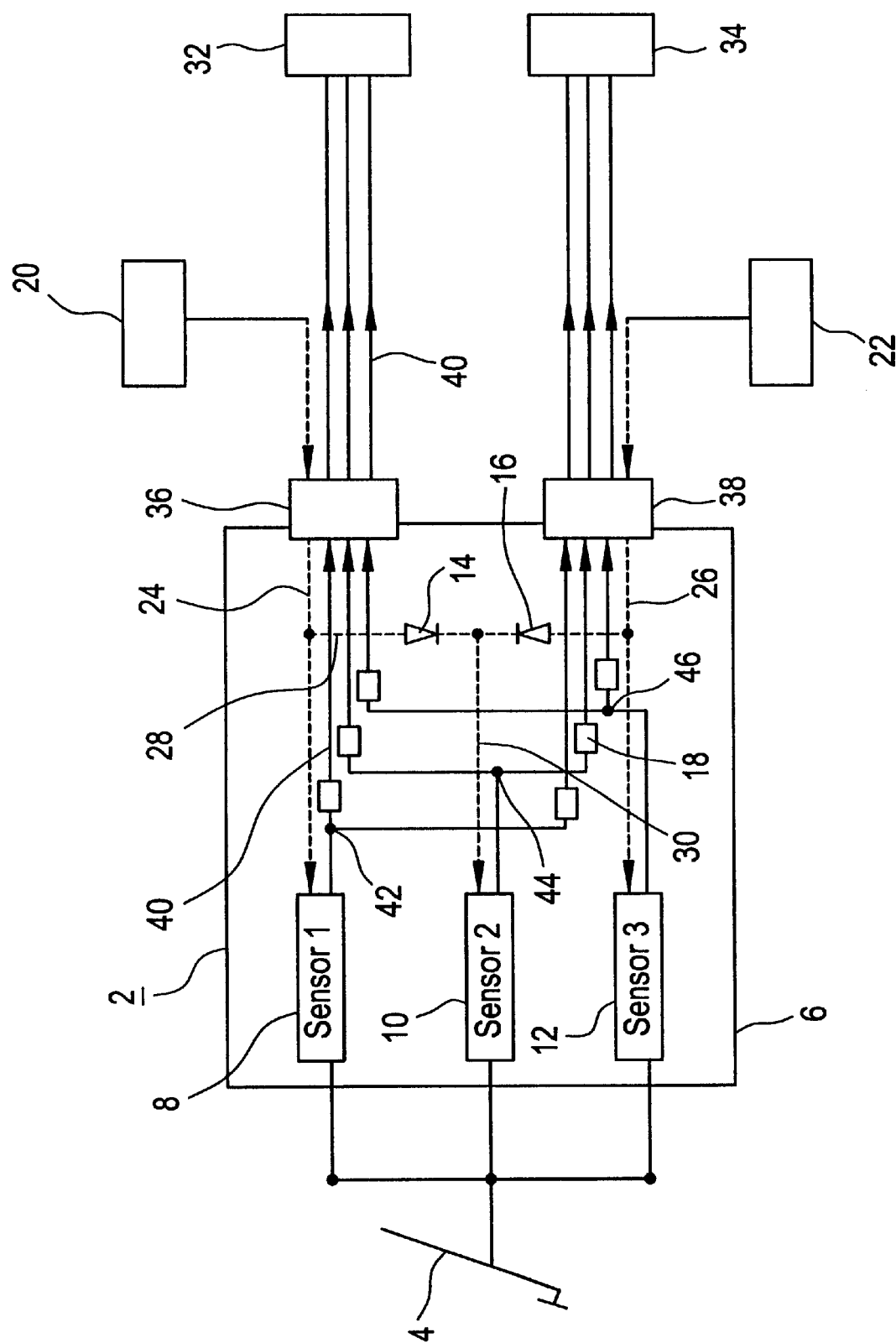

FAIL-SAFE BRAKE SYSTEM

INTRODUCTION AND BACKGROUND

The present invention pertains to a fail-safe system, in particular, an electromechanical brake system which contains the following components:

an actuating device that can be moved into different positions from a starting position, three sensors that generate a measuring signal which corresponds to the position of the actuating device independently of one another, wherein the first of the three sensors is supplied with energy by a first independent energy source via a first supply path, and wherein the second of the three sensors is supplied with energy by a second independent energy source via a second supply path.

A sensor that generates a measuring signal which corresponds to the position of the actuating device may, for example, consist of a displacement sensor that measures the distance from the starting position of the actuating device to an actuating position. However, such a sensor may also consist of a force sensor that measures the force required for moving the actuating device from the starting position into an actuating position. Other sensor designs would also be conceivable.

The invention is described below with reference to an electromechanical brake system. However, the invention may also be used in other fail-safe systems, e.g., in an electromechanical steering system. In an electromechanical brake system, the initially mentioned actuating device consists of the brake pedal. In this case, the driver decelerates the motor vehicle by exerting a certain force upon the brake pedal with the foot, wherein the effect of the force exerted upon the pedal is measured by sensors and converted into an electric signal. This signal is forwarded to brake actuators, one of which is assigned to each wheel of the motor vehicle. Each brake actuator exerts a braking force (that depends on the force exerted upon the brake pedal by the foot of the driver) upon the corresponding wheel of the motor vehicle with the aid of an electric motor.

DE 195 10 525 A1 discloses a method for controlling or regulating an electromechanical brake system of a motor vehicle. The electromechanical brake system contains a brake pedal, the actuation of which is measured by three sensors that operate independently of one another. The measuring signals generated by the sensors are forwarded to microprocessors of a computer system. Among other things, the measuring signals are checked for errors in the microprocessors. In addition, the nominal value for the braking force desired by the driver is determined in the microprocessors based on the measuring signals. This nominal value is adjusted in the electromechanical brake system by the microprocessors after calculations are completed.

The three sensors of the brake system known from DE 195 10 525 A1 respectively contain a separate energy supply. Consequently, if an energy source fails and the corresponding sensor is no longer supplied with energy, this does not interfere with the energy supply of the remaining sensors, i.e., two of three measuring signals are still generated. The microprocessors of the computer system are able to determine with the aid of a majority decision which of the three sensors has failed, wherein the brake system remains operative. The electromechanical brake system known from DE 195 10 525 A1 can still be designated as safe if one of the energy sources that supplies a sensor fails. However, this electromechanical brake system has a relatively complicated design due to the arrangement of three sensors that are respectively supplied by an independent energy source.

An object of the present invention is a fail-safe brake system that has a high safety standard despite a simple design.

SUMMARY OF THE INVENTION

The above and other objects of the present invention can be achieved by a fail-safe brake system, particularly an electromechanical brake system comprising an actuating device that can be moved into different positions from a starting position, and three sensors that generate a measuring signal which corresponds to the position of the actuating device independently of one another, wherein the first of the three sensors is supplied with energy by a first independent energy source via a first supply path, and wherein the second of the three sensors is supplied with energy by a second independent energy source via a second supply path, characterized by the fact that the first and the second supply path are connected to one another via a connecting line which respectively contains two diodes or two elements that have the function of a diode, that a third supply path branches off the connecting line between the first and the second diode, wherein the third supply path leads to the third sensor, and that the diodes are oriented in the connecting line in such a way that the flow-through direction of the first diode extends from the first supply line to the third supply line and the flow-through direction of the second diode extends from the second supply line to the third supply line.

BRIEF DESCRIPTION OF DRAWING

The present invention will be further understood with reference to the accompanying drawing which is a schematic representation of a fail-safe brake system according to the invention.

DETAILED DESCRIPTION OF THE INVENTION

The advantages attained with the invention can, in particular, be seen in the fact that the fail-safe system contains only two energy sources, i.e., at least one energy source less than the fail-safe system known from DE 19,510,525 A1. Due to the elimination of at least one energy source, the design of the fail-safe system can be significantly simplified. In addition, the costs for the fail-safe system are reduced because only two energy sources are required and the charge status of only two energy sources needs to be monitored with corresponding components.

Despite these advantages, the fail-safe system according to the invention has the same safety standard as the fail-safe system known from DE 19,510,525 A1. If one of the two energy sources fails, two of the three sensors are still supplied with electric energy as described below: one of the three sensors is "directly" supplied with energy by the operative energy source; the third sensor is supplied with energy via the supply path that extends from the operative energy source to the diode, the flow-through direction of which extends from the operative energy source to the third supply path. Since two of the three sensors are still supplied with energy if one of the two energy sources fails, it is also possible to carry out a majority decision as to which of the three sensors has failed in a microprocessor of the fail-safe system, where after it can be deduced which of the energy sources has failed.

Another advantage of the invention is that the third sensor of the system is always supplied with energy independently of which energy source has failed (the only instance in which the third sensor is not supplied with energy occurs when both energy sources fail simultaneously; however, this would represent a total failure of the system and is highly improbable). Due to this measure, the third sensor can be of particular importance, e.g., designed with a particularly high measuring accuracy.

According to the additional development of the invention, the fail-safe system contains at least two functionally separate circuits, wherein the first circuit is supplied with energy by the first energy source and the second circuit is supplied with energy by the second energy source, and wherein the measuring signals of all three sensors are fed to each circuit. The advantage of this additional development can be seen in the fact that, if one of the two circuits fails (e.g., due to a failure of an energy source), the other circuit of the fail-safe system remains functional. Another advantage of this additional development is that the measuring signals of all three sensors are present in each circuit of the fail-safe system, i.e., the measuring signals of the sensors can be processed independently of one another in each circuit.

According to the additional development of the invention, the measuring signals of all three sensors are fed to an intelligent unit in each circuit, wherein a majority decision and, if so required, a plausibility check is carried out in the intelligent unit (e.g., a microprocessor). The advantage of this additional development can be seen in the fact that the measuring signals of the three sensors are checked in intelligent units that are provided in the fail-safe system anyhow. For example, each brake actuator of an electromechanical brake system contains a microprocessor that adjusts the nominal value for the braking force on the brake actuator. Since intelligent units which are provided in the fail-safe system anyhow are used for this purpose, additional microprocessors that would be exclusively responsible for the central monitoring of the measuring signals and subsequently distribute the result in the system can be eliminated. This results in a significant cost reduction because at least three additional microprocessors would have to be provided for checking the measuring signals for safety reasons. If one of the microprocessors that check the measuring signals failed, this would have to be determined by means of a majority decision carried out by the other two microprocessors. However, if the measuring signals are, for example, evaluated in the microprocessor of a brake actuator, a failure of this microprocessor would merely lead to one brake actuator no longer being under control. However, the other brake actuators remain fully functional.

According to the additional development of the invention, each signal line that leads from one of the sensors to one of the circuits of the system contains a signal circuit protection control that electrically decouples the sensor from the respective circuit of the system if an electric fault occurs in the respective circuit. The advantage of this additional development can be seen in the fact that the sensors also continue to operate if an electric fault occurs in one of the circuits of the fail-safe system, i.e., the measuring signals of all sensors remain available for the other circuit of the fail-safe system. The signal circuit protection control may simply be realized in the form of a fuse; a person skilled in the art is familiar with other possible designs of a signal circuit protection control.

According to the additional development of the invention, no electric components of the respective circuit are situated between the respective sensor and the signal circuit protection control. The advantage of this additional development can be seen in the fact that the signal circuit protection control decouples the respective sensor from the respective circuit if any of the electric components of this circuit fail.

According to the additional development of the invention, a separate plug connector is provided for each circuit of the fail-safe system. The signals of all three sensors are fed to the respective circuits via these plug connectors. The plug connectors that connect the circuits of the fail-safe system to the sensors can also be designated as fail-safe components of the system because they may, for example, "fall off." Due to the redundant design of the plug connectors, the safety of the system is increased because the circuits of the system, the plug connectors of which have not fallen off, remain functional if one of the plug connectors falls off.

According to the additional development of the invention, the sensors generate a digital pulse width-modulated or frequency-modulated signal. The advantage of this additional development can be seen in the fact that pulse width-modulated or frequency-modulated signals are less susceptible to interferences than analog signals, and that less transmission energy is required for the digital data transmission.

One embodiment as well as additional advantages of the invention are described below with reference to the figure which schematically shows a fail-safe system.

The fail-safe system 2, in this case an electromechanical brake system, is equipped with an actuating device 4 in the form of a brake pedal 4. The brake system is also equipped with a pedal sensor distribution circuit 6 with sensors 8, 10 and 12 that generate a signal which corresponds to the position of the brake pedal 4 when the brake system is actuated. The pedal sensor distribution circuit 6 also contains diodes 14 and 16 as well as signal circuit protection controls 18. The sensors 8, 10 and 12 are connected to the plug connectors 36 and 38 via the signal lines 40 which respectively contain a signal circuit protection control 18. The aforementioned plug connectors serve for distributing the signals of the sensors 8, 10 and 12 into the first brake circuit of the electromechanical brake system or into the second brake circuit of the electromechanical brake system. The measuring signals of the sensors 8, 10 and 12 are fed to microprocessors 32 or 34 in the independent brake circuits (in the figure, only one microprocessor per brake circuit is shown; however, each brake circuit may also contain several microprocessors, e.g., each brake actuator may contain a separate microprocessor). The pedal sensor distribution circuit may be realized in the form of one component.

Each brake circuit of the system is provided with a separate energy source 20 or 22, wherein the energy source 20 directly supplies the first sensor 8 with energy via the first supply path 24, and wherein the energy source 22 directly supplies the second sensor 12 with energy via the second supply path 26. The first supply path 24 and the second supply path 26 are connected to one another via a connecting line 28. The connecting line 28 contains two diodes 14 and 16, wherein a third supply path 30 that leads to the third sensor 10 branches off between the two diodes 14 and 16. The diodes 14 and 16 are oriented in the connecting line 28 in such a way that the flow-through direction of the first diode 14 extends from the first supply line 24 to the third supply line 30 and the flow-through direction of the second diode 16 extends from the second supply line 26 to the third supply line 30.

If both energy sources 20 and 22 of the electromechanical brake system 2 are fully functional, all three sensors 8, 10 and 12 are supplied with energy. However, if the energy source 20 fails, the first sensor 8 is no longer supplied with energy via the first supply path 24. However, the sensors 10 and 12 are still supplied with energy by the energy source 22 as described below. The second sensor 12 is "directly" supplied with energy by the energy source 22 via the second supply path 26. The third sensor 10 is supplied with energy by the second energy source 22 via the supply path 26, the connecting line 28 and the third supply path 30 because the flow-through direction of the second diode 16 extends from the second energy source 22 to the third supply path 30 and the third sensor 10. If the first energy source 20 fails, the measuring signal of the first sensor 8 is lacking, but the measuring signals of sensors 10 and 12 continue to be generated. When the electromechanical brake system is actuated, only the measuring signals of the sensors 10 and 12 are forwarded to the microprocessors 32 and 34. Based on the received measuring signals, a majority decision whether and how the electromechanical brake system was actuated can be carried out in the microprocessors 32 and 34. If two of the three sensors deliver a measuring signal, the microprocessors 32 and 34 assume that one of the sensors has failed and the electromechanical brake system is actuated.

It can also be determined which of the energy sources 20 or 22 has failed in the microprocessors 32 and 34. When the microprocessors 32 and 34 receive measuring signals from the sensors 10 and 12, but no measuring signal from the first sensor 8, this indicates that the first energy source 20 has failed because the first sensor 8 is exclusively supplied with energy by this energy sources. A corresponding error message can then be generated by the microprocessors 32 and 34.

The previous explanations apply analogously if the energy source 22 fails instead of the energy source 20. In this case, a measuring signal is no longer generated by the second sensor 12, but the sensors 8 and 10 continue to generate measuring signals. It should be noted that the third sensor 10 is, independently of which of the energy sources 20 or 22 fails, always supplied with energy by the other energy source.

Each signal line 40 that connects one of the sensors 8, 10 and 12 to one of the brake circuits of the electromechanical system contains a signal circuit protection control 18. This signal circuit protection control electrically decouples the sensors from the circuits of the electromechanical brake system. For example, if an electric fault occurs in the brake circuit that is supplied with energy by the energy source 20, this fault does not affect the sensors 8, 10 and 12 due to the signal circuit protection control 18, i.e., the measuring signals of the sensors are still available for the second brake circuit. The signal circuit protection controls 18 are preferably arranged directly behind the branch points 42, 44 and 46 (viewed from the sensors), in which the signal line of a sensor is divided into two branches, each of which leads to the plug connectors 36 or 38, i.e., no additional electric components are situated between the sensors and the signal circuit protection controls.

What is claimed is:

1. A fail-safe brake system comprising:

an actuating device that can be moved into different positions from a starting position, three sensors that generate a measuring signal which corresponds to the position of the actuating device independently of one another, wherein the first of the three sensors is supplied with energy by a first independent energy source via a first supply path, and wherein the second of the three sensors is supplied with energy by a second independent energy source via a second supply path, and wherein the first and the second supply path are connected to one another via a connecting line which respectively contains two diodes or two elements that have the function of a diode, and a third supply path branches off the connecting line between the first and the second wherein the third supply path leads to the third sensor, and wherein the diodes are oriented in the connecting line in such a way that the flow-through direction of a first of said diodes extends from the first supply path to the third supply path and the flow-through direction of a second of said diodes extends from the second supply path to the third supply path.

2. The fail-safe system according to claim 1, further comprising at least two circuits that function independently of one another, wherein the first circuit is supplied with energy by the first energy source and the second circuit is supplied with energy by the second energy source and wherein measuring signals of all three sensors are fed to each circuit.

3. The fail-safe system according to claim 2, wherein the measuring signals of all three sensors are fed to an intelligent unit in each circuit, and a majority decision and, if so required, a plausibility check is carried out in the intelligent unit.

4. The fail-safe system according to claim 2, wherein each signal line that leads from one of the sensors to one of the circuits of the system contains a signal circuit protection control that electrically decouples the said one sensor from the respective circuit of the system if an electric fault occurs in this circuit.

5. The fail-safe system according to claim 3, herein each signal line that leads from one of the sensors to one of the circuits of the system contains a signal circuit protection control that electrically decouples the said one sensor from the respective circuit of the system if an electric fault occurs in this circuit.

6. The fail-safe system according to claim 4, wherein no electric components of the respective circuit are situated between the sensor and the signal circuit protection control.

7. The fail-safe system according to claim 5, wherein no electric components of the respective circuit are situated between the sensor and the signal circuit protection control.

8. The fail-safe system according to claim 2, further comprising a separate plug connector provided for each circuit of the system, wherein the signals of all three sensors are fed to the respective circuits via the aforementioned plug connectors.

9. The fail-safe system according to claim 3, further comprising a separate plug connector provided for each circuit of the system, wherein the signals of all three sensors are fed to the respective circuits via the aforementioned plug connectors.

10. The fail-safe system according to claim 4, further comprising a separate plug connector provided for each circuit of the system, wherein the signals of all three sensors are fed to the respective circuits via the aforementioned plug connectors.

11. The fail-safe system according to claim 5, further comprising a separate plug connector provided for each circuit of the system, wherein the signals of all three sensors are fed to the respective circuits via the aforementioned plug connectors.

12. The fail-safe system according to claim 1, wherein the sensors generate a digital pulse width-modulated or frequency-modulated signal.

13. The fail-safe system according to claim 2, wherein the sensors generate a digital pulse width-modulated or frequency-modulated signal.

14. The fail-safe system according to claim 3, wherein the sensors generate a digital pulse width-modulated or frequency-modulated signal.

* * * * *